United States Patent [19]

Yamauchi et al.

[11] Patent Number: 5,411,904
[45] Date of Patent: May 2, 1995

[54] PROCESS FOR FABRICATING NONVOLATILE RANDOM ACCESS MEMORY HAVING A TUNNEL OXIDE FILM

[75] Inventors: Yoshimitsu Yamauchi, Yamatokoriyama; Kenichi Tanaka, Nara; Keizo Sakiyama, Kashihara; Akitsu Ayukawa, Nara, all of Japan

[73] Assignee: Sharp Kabushiki Kaisha, Osaka, Japan

[21] Appl. No.: 231,740

[22] Filed: Apr. 25, 1994

Related U.S. Application Data

[62] Division of Ser. No. 793,567, Nov. 18, 1991, abandoned.

[30] Foreign Application Priority Data

Nov. 19, 1990 [JP] Japan ..................... 2-313445
Nov. 30, 1990 [JP] Japan ..................... 2-339759

[51] Int. Cl.⁶ ............................................ H01L 21/266
[52] U.S. Cl. ................................... 437/43; 437/47; 437/985
[58] Field of Search ............ 437/43, 47, 979, 985; 156/644, 651; 148/DIG. 116, DIG. 163

[56] References Cited

U.S. PATENT DOCUMENTS

| | | | |
|---|---|---|---|
| 4,642,881 | 2/1987 | Matsukawa et al. | 437/43 |
| 4,727,043 | 2/1988 | Matsumoto et al. | 437/43 |
| 4,945,068 | 7/1990 | Sugaya | 437/43 |
| 5,019,879 | 5/1991 | Chiu | 437/43 |
| 5,181,188 | 1/1993 | Yamauchi et al. | 365/185 |

OTHER PUBLICATIONS

IEDM 1989 Dec. "A Versatile Stacked Storage . . . NVRAM Applications", Yamauchi et al, pp. 25.5.1–25.5.4.
IEDM 1990 Dec. "A 4M Bit NVRAM Technology . . . Cell Structure", Yamauchi et al, pp. 5.9.1–5.9.3.

*Primary Examiner*—Brian E. Hearn
*Assistant Examiner*—Chandra Chaudhari
*Attorney, Agent, or Firm*—Nixon & Vanderhye

[57] ABSTRACT

A nonvolatile random access memory comprising a nonvolatile random access memory unit having on a substrate an EEPROM having a tunnel oxide film and a floating gate, and a DRAM linked to the EEPROM, a thermal oxide film being selectively formed between the EEPROM and another EEPROM adjacent thereto, the tunnel regions of the respective EEPROMs being provided as self-aligned with the respective ends of the thermal oxide film and positioned at the respective ends of an impurity ion implantation pattern for use in forming a source region of the EEPROMs.

2 Claims, 4 Drawing Sheets

PROCESS FOR FABRICATING NONVOLATILE RANDOM ACCESS MEMORY HAVING A TUNNEL OXIDE FILM

This is a divisional of application Ser. No. 07/793,567, now abandoned, filed Nov. 18, 1991.

BACKGROUND OF THE INVENTION

1. Field of the Invention

The present invention relates to nonvolatile memories, and more particularly to a nonvolatile memory comprising a FLOTOX type memory (Floating gate with tunnel oxide) and to a process for fabricating the same.

2. Description of the Related Art

So-called nonvolatile random access memories comprising an EEPROM and a DRAM in combination have recently attracted attention as nonvolatile semiconductor devices which are randomly accessible.

The nonvolatile random access memory (hereinafter referred to as "NV-DRAM") is smaller in cell size than conventional nonvolatile devices comprising an EEPROM and an SRAM in combination and makes it possible to realize a higher packing density.

FIG. 6 shows a typical example of NV-DRAM. With reference to the drawing, the NV-DRAM comprises a semiconductor substrate 1, and transistors formed on the substrate, i.e., a transistor MT of FLOTOX structure constituting an EEPROM, and MOS transistors T1 and T2 constituting a DRAM. In the drawing, indicated at 2a is a tunnel oxide film, at 3 a floating gate, at 4 a select gate, at 5 a recall gate, at 6 a control gate, at 7 a bit line, and at 8 a polysilicon layer serving as a charge storage node for the DRAM. FIG. 7 shows a circuit equivalent to the NV-DRAM.

With the conventional NV-DRAM, the tunnel oxide film is formed by photolithography for tunnel region patterning after ion implantation for forming the source region S of the EEPROM.

Accordingly, the conventional tunnel oxide film is laid out in the active region 9 of the NV-DRAM within an impurity ion implantation pattern 10 for forming the source region as seen in FIG. 2.

Thus, the layout of tunnel oxide film of the conventional NV-DRAM involves a restriction in that the tunnel oxide film is so positioned as to be included within the impurity ion implantation pattern 10. Additionally, since the region of tunnel oxide film is formed by photolithography, the reduction in the size or width thereof is limited, consequently presenting difficulties in providing NV-DRAMs of reduced size with a higher packing density.

Further, the area of the tunnel oxide film depends on the accuracy of microscopic processing technology in photoetching, limiting the reduction in area. At the same time, the conventional fabrication process involves a problem of misalignment of the tunnel oxide region with the impurity diffusion region, limiting scale-down in cell size.

SUMMARY OF THE INVENTION

An object of the present invention, which has been accomplished in view of the foregoing situation, is to provide a structure which makes it possible to fabricate FLOTOX type memory comprising the area of tunnel oxide formed as self-aligned with diffused region.

Another object of the invention is to provide a process for fabricating an NV-DRAM in which an EEPROM having a microscopic area of tunnel oxide can be easily and efficiently formed without misalignment.

Accordingly, the present invention provides a nonvolatile random access memory comprising a nonvolatile random access memory unit having on a substrate an EEPROM having a tunnel oxide film and a floating gate, and a DRAM linked to the EEPROM, a thermal oxide film being selectively formed between the EEPROM and another EEPROM adjacent thereto, the tunnel regions of the respective EEPROMs being provided as self-aligned with the respective ends of the thermal oxide film and positioned at the respective ends of an impurity ion implantation pattern for use in forming a source region for the EEPROMs.

According to the present invention, the tunnel oxide film is so laid out that the film is formed as self-aligned with the end of an impurity ion implantation pattern for forming the source region for the EEPROM. This makes it possible to reduce the size of the impurity ion implantation pattern and therefore to provide cells with an increased packing density.

The present invention further provides a process for fabricating a nonvolatile random access memory comprising fabricating a write/erase nonvolatile random access memory unit having a floating gate with a tunnel oxide film,
the tunnel oxide film being formed by the steps of:
(a) forming an ion implantation mask on a semiconductor substrate having a gate oxide film, the mask having an ion implantation window;
(b) implanting an impurity ion in the surface layer of the substrate under the window through the window and the gate oxide film;
(c) etching away the gate oxide film from the substrate through the window to form an opened substrate exposed portion having a larger width than the window;
(d) oxidizing the substrate exposed portion to form a selectively oxidized layer having an oxidized central portion corresponding to the ion-implanted region and a substantially unoxidized peripheral portion;
(e) heat-treating the substrate to form an impurity-diffused region; and
(f) oxidizing the unoxidized portion of the selectively oxidized layer after cleaning the unoxidized portion.

Thus, the tunnel oxide film, which is thin, is formed as self-aligned with the ion implantation pattern utilizing the fact that an oxide film is selectively formed during thermal oxidation in the semiconductor portion doped with the impurity ion.

DESCRIPTION OF THE PREFERRED EMBODIMENTS

Figure 1:
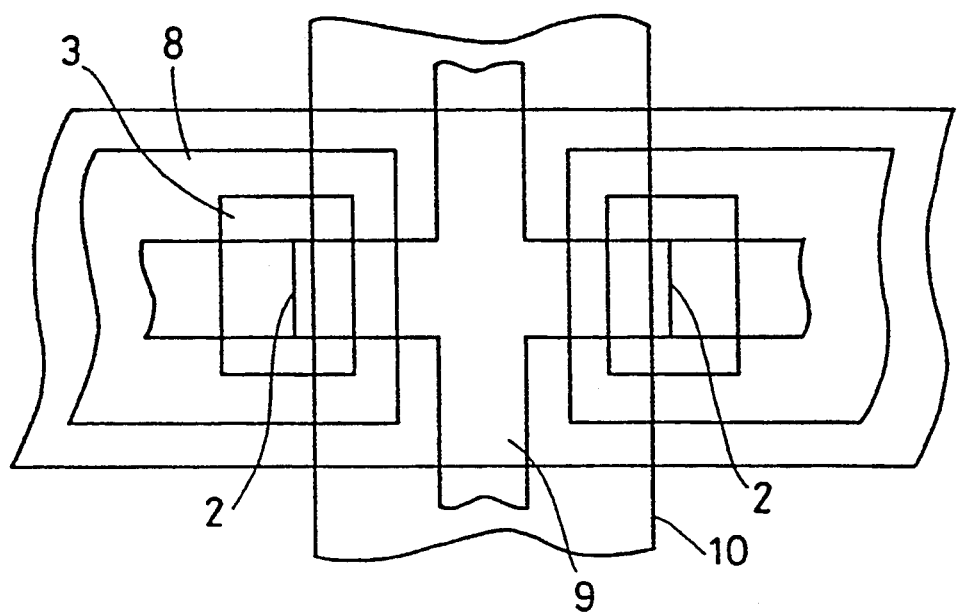
FIG. 1 is a diagram showing the concept of layout of the NV-DRAM according to the invention.
Figure 2:
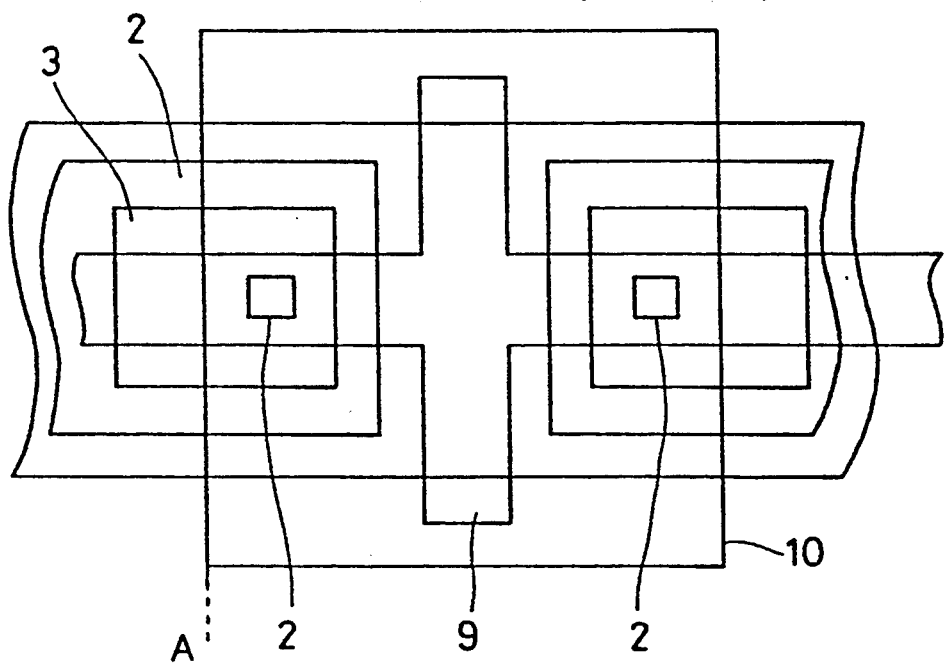
FIG. 2 is a diagram corresponding to FIG. 1 and showing a conventional NV-DRAM.

With the nonvolatile random access memory of the present invention, the tunnel oxide film is formed at the end of the impurity ion implantation pattern as shown in FIG. 1, so that there is no need to provide an allowance for the alignment of a mask for forming the tunnel region. Further because the tunnel regions of adjacent two EEPROMs can be formed using a single pattern, the distance between the EEPROMs can be made shorter. Furthermore, arrays of many NV-DRAMs can be formed symmetrically with use of a strip of impurity ion implantation pattern. This makes it possible to provide NV-DRAMs with an increased density also microscopically. The tunnel oxide film, which can be formed as self-aligned with the pattern, results in a further reduction in cell size.

The nonvolatile random access memory of the invention and the process for fabricating the same will be described in greater detail with reference to the illustrated embodiment.

Figure 3:
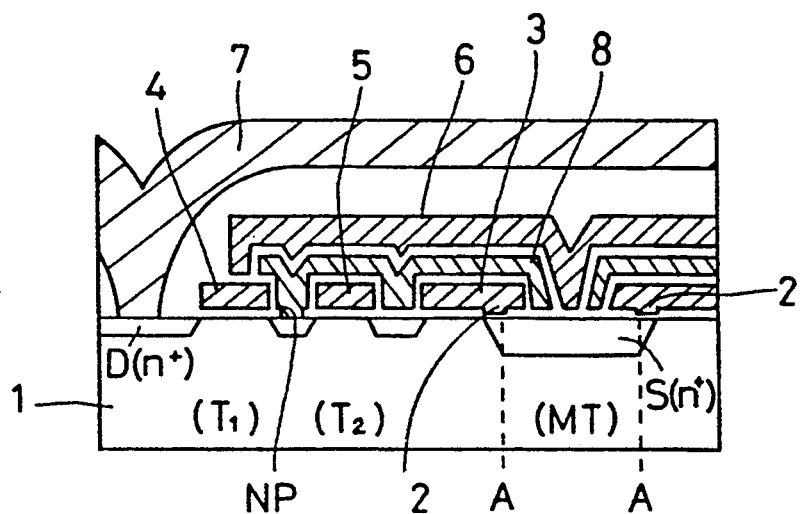
FIG. 3 is a diagram showing the construction of the embodiment of NV-DRAM of the invention.
Figure 7:
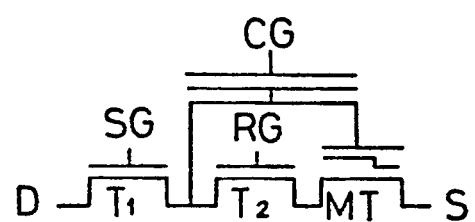
FIG. 7 is a diagram of the equivalent circuit of the NV-DRAM of FIG. 6.

FIG. 3 is a diagram illustrating the construction of NV-DRAM of the invention. As shown in the drawing, the NV-DRAM comprises a transistor MT (EEPROM) of FLOTOX structure having a tunnel oxide film 2 and a floating gate 3, a transistor T1 (DRAM) having a select gate 4, and a transistor T2 having a recall gate 5, the transistors being formed on a substrate 1 of p-type silicon semiconductor. A charge storage polysilicon layer 8 extends from NP (node point) and covers the transistors MT and T1. A control gate 6 is further formed over the layer 8. The gates and the polysilicon layer are each separated off by a dielectric layer and an insulation layer. The NV-DRAM is equivalent also to the circuit of FIG. 7.

Figure 4:
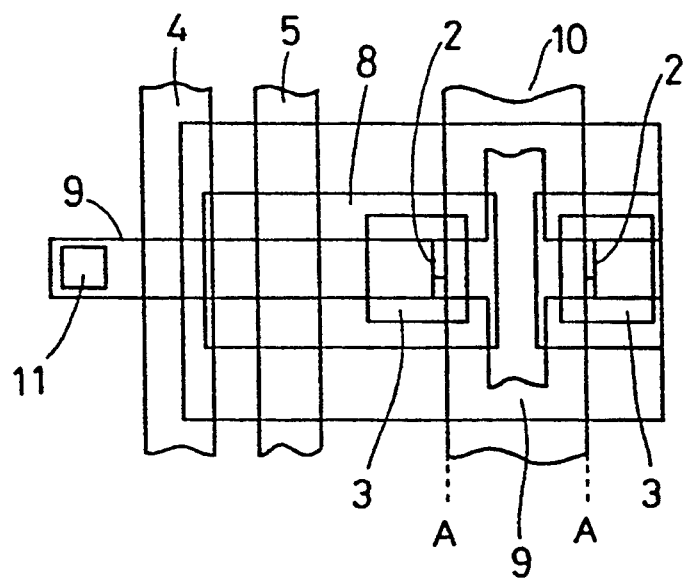
FIG. 4 is a diagram showing the layout of the same.

The source region S of the transistor MT is formed by the implantation of an impurity ion in the semiconductor substrate 1 and the subsequent thermal diffusion. The area marked off by A—A in the drawing represents a pattern for impurity ion implantation. The tunnel oxide film 2 is positioned outside of but adjacent to the pattern. FIG. 4 shows a layout including the tunnel oxide film region. Indicated at 11 is a bit contact, and at 9 the active region of the NV-DRAM. The tunnel oxide film region is positioned within the active region, as self-aligned with one end of the ion implantation pattern.

Although the drawing shows only one NV-DRAM, like NV-DRAMs are formed in opposed relation symmetrically with respect to the source region S according to the present embodiment. The ion implantation pattern extends upward and downward in FIG. 4, and an array of many NV-DRAMs are arranged as centered on the pattern.

The process for fabricating the NV-DRAM will be described with reference to FIG. 5.

Figure 5:
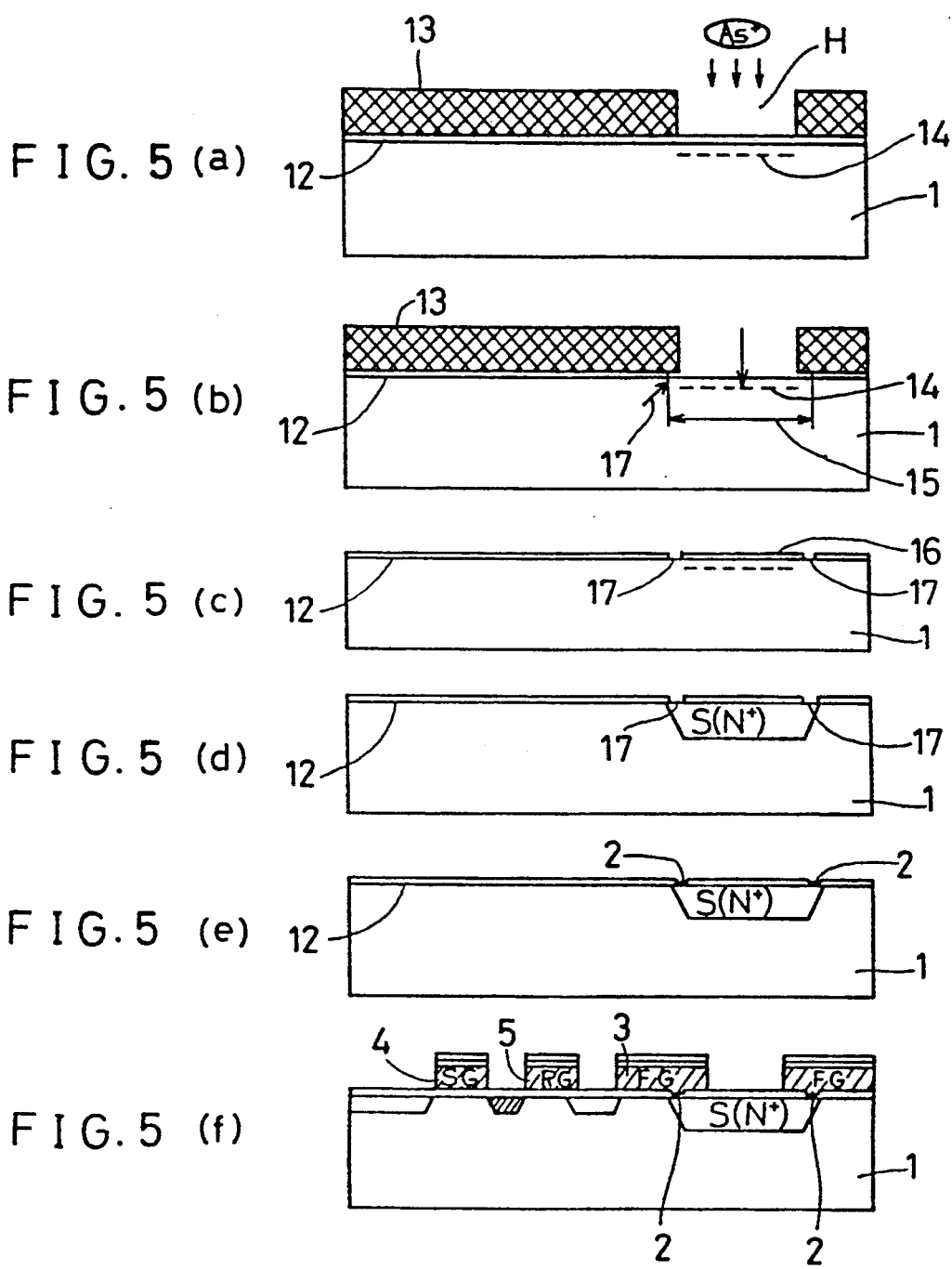
FIG. 5 is a diagram showing the process for producing the NV-DRAM of FIG. 3.
Figure 6:
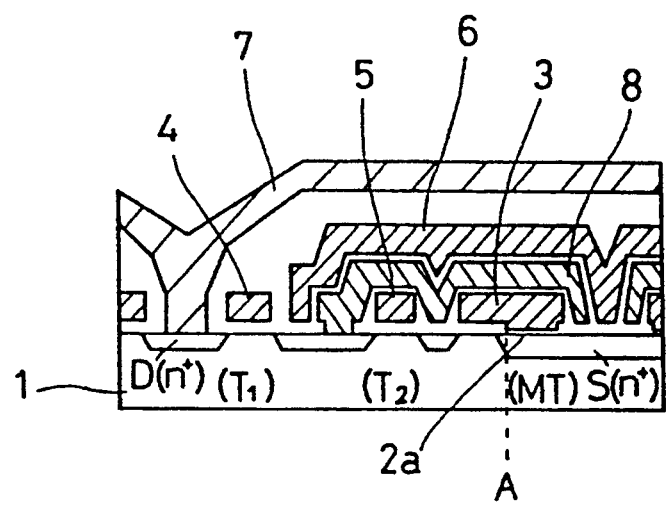
FIG. 6 is a diagram showing the basic construction of the conventional NV-DRAM.

First as seen in FIG. 5, (a), a p-type silicon semiconductor substrate 1 is formed with a gate oxide film 12 (about 300 μn in thickness) thereon, and with a resist 13 over the film. An ion implantation pattern H having a specified size is formed by lithography at a predetermined portion of the resist 13.

Next, an impurity ion (e.g., B+ ion) is implanted in the surface layer of the substrate 1 through the pattern H and the gate oxide film 12, with the resist 13 serving as a mask. The impurity ion may be of the n type or p type and is selected in view of the conduction type of the substrate 1. The ion-implanted portion 14 thus formed is approximately of the same width as the pattern H.

Subsequently, the gate oxide film 12 is locally etched away through the pattern H first by anisotropic etching (ion etching) and then by isotropic etching (RIE) (FIG. 5, (b)). The etching step forms in the gate oxide film 12 a substrate exposed portion 15 having a larger width than the opening width of the pattern H. With the present embodiment, the increase in width is about 0.1 μm.

With the exposed portion 15 thus formed, the substrate is subjected to thermal oxidation, which can be conducted, for example, by the low-temperature dry oxidation method at a temperature of up to 700° C. The thermal oxidation step forms thermally oxidized layer 16 at the exposed portion of the substrate surface. This layer is formed selectively over the impurity-doped central portion, but substantially no oxidized layer is formed on the peripheral portion 17 (FIG. 5, (c)). According to the present embodiment, the oxidized layer 16 formed over the central portion is about 200 angstroms in thickness, whereas the peripheral portion is formed with an oxide molecule layer of a thickness below the measurable limit (below 20 angstroms), if any.

The peripheral portion 17 is then cleaned by etching, and the substrate is thereafter heat-treated (at about 900° C.) for annealing, whereby the impurity ion in the doped portion is thermally diffused to the portion below the tunnel oxide film region to be formed, consequently forming an impurity-diffused region, i.e., a source region S (FIG. 5, (d)). The substrate is thereafter subjected to thermal oxidation again to form a tunnel oxide film 2 having a thickness of about 80 angstroms as shown in FIG. 5, (e)). The self-aligned tunnel oxide film 2 has a small width approximately equal to the width of the peripheral portion 17 shown in FIG. 5, (b) and has a much smaller area than the conventional tunnel oxide film formed as by lithography.

After the tunnel oxide film 2 has been formed in a self-aligned manner in this way, a floating gate 3, select gate 4 and recall gate 5 of polysilicon, and diffused regions for the select gate and recall gate are formed by known methods as shown in FIG. 5, (f).

These steps are followed by the formation of a separation dielectric film or interlayer insulation film of silicon oxide of silicon nitride, formation of a charge storage polysilicon layer, formation of a control gate, metal wiring, etc., whereby an NV-DRAM of the present invention is obtained as seen in FIG. 3. We have found that the above process affords NV-DRAMs having a greatly reduced size and measuring, for example, 0.6 μn² in cell area.

With the NV-DRAM of the present invention described above, the impurity-implanted region of the EEPROM can be formed without being restricted by the region of tunnel oxide film, and the tunnel oxide film itself can be formed with a greatly reduced width in a self-aligned fashion. Accordingly, the present invention has a very great technical value in providing NV-DRAMs of reduced cell size with a higher density.

What we claim is:

1. A process for fabricating a nonvolatile memory having a floating gate with a tunnel oxide film, said tunnel oxide film being formed by the steps of:

(a) forming an ion implantation mask on a semiconductor substrate having a gate oxide film, said mask having an ion implantation window;
(b) implanting an impurity ion in a surface layer of said substrate through said window and said gate oxide film;
(c) etching away said gate oxide film from said substrate through said window to form an opened substrate exposed portion having a larger width than said window;
(d) oxidizing said substrate exposed portion to form a selectively oxidized layer having an oxidized central portion corresponding to the ion-implanted region and a substantially unoxidized peripheral portion;
(e) heat-treating said substrate to form an impurity-diffused region; and
(f) oxidizing the unoxidized portion of said selectively oxidized layer after cleaning said unoxidized peripheral portion.

2. A process for fabricating a non-volatile memory of claim 1 which is comprised of an EEPROM having said tunnel oxide film.

* * * * *